(12) United States Patent
Tokue

(10) Patent No.: US 6,989,771 B2
(45) Date of Patent: Jan. 24, 2006

(54) ENCODER

(75) Inventor: Masahiro Tokue, Tokyo (JP)

(73) Assignee: Niles Co., Ltd., (JP)

( * ) Notice: Subject to any disclaimer, the term of this patent is extended or adjusted under 35 U.S.C. 154(b) by 0 days.

(21) Appl. No.: 10/979,211

(22) Filed: Nov. 3, 2004

(65) Prior Publication Data
US 2005/0104749 A1    May 19, 2005

(30) Foreign Application Priority Data
Nov. 18, 2003    (JP)    ............................. 2003-387505

(51) Int. Cl.
*H03M 1/22*    (2006.01)

(52) U.S. Cl. ...................................................... 341/11

(58) Field of Classification Search ................ 341/115, 341/11, 6, 35, 192; 318/801, 809, 783
See application file for complete search history.

(56) References Cited

U.S. PATENT DOCUMENTS 3,967,173 A * 6/1976 Stich .......................... 318/811
4,322,671 A * 3/1982 Kawada et al. .............. 318/798
4,570,214 A * 2/1986 Tanaka ........................ 363/160
4,623,939 A * 11/1986 Machida et al. ............. 369/239
2005/0134490 A1 * 6/2005 Cox ............................ 341/141

FOREIGN PATENT DOCUMENTS

JP    2002-357456    12/2002

* cited by examiner

*Primary Examiner*—Peguy JeanPierre
(74) *Attorney, Agent, or Firm*—Rader, Fishman & Grauer PLLC

(57) ABSTRACT

An encoder includes comparators CP4 and CP5 which are provided in such a manner as to correspond to phase A and B respectively and detect a state where the output voltages deviate from their normal ranges. Transistors TR4 and TR5 which operate according to the outputs of the respective corresponding comparators are connected through resistors R8 and R18, respectively, to an output line of phase Z. When each output line connecting to a phase-A output terminal QA or a phase-B output terminal QB is short-circuited to ground, or a signal line 41A or 42B connecting the output terminal with a electronic control unit 40 is broken, the transistor TR4 or TR5 is turned on and the output of phase Z falls below its normal range, thereby a malfunction is detected. Even if one of the transistors of phase A and phase B breaks down, a malfunction in the other phase is transmitted to phase.

4 Claims, 8 Drawing Sheets

L1, P1 : Phase A
L2, P2 : Phase B
L3, P3 : Phase Z

US 6,989,771 B2

ENCODER

BACKGROUND OF THE INVENTION

1. Field of the Invention

The present invention relates to an encoder which detects an angle of rotation or the like and which also detects occurrence of an electrical malfunction.

2. Description of the Related Art

An encoder has been used, for example, in a steering angle sensor which detects a steering angle of a vehicle. Such an encoder cannot be used in a control that requires reliability unless it gives information as to whether malfunction such as break or short circuit exists therein as well as simply detecting the angle, speed, or direction of rotation.

Therefore, a conventional encoder is provided with a malfunction-detecting circuit in its inside where a malfunction signal detected by the encoder is outputted to an electronic control unit by a signal line separate from a signal line of encoder outputs with regard to the steering wheel sensor.

However, with the above encoder there is a problem that dedicated signal line is needed, and in order to solve the problem, the following technology is proposed in Japanese Unexamined Patent Publication No. 2002-357456, for example. In an encoder which generates each pulse signal for phase A and phase B, which are displaced with each other by a predetermined angle, and for phase Z at a predetermined angle, a malfunction detection signal is superimposed on the phase Z to identify the occurrence of malfunction from an output voltage of the phase Z.

This encoder is provided with two comparators for the phase A and the phase B, and includes an OR circuit which obtains a logical sum of the outputs and one transistor which is driven by the OR circuit to add the transistor output to phase Z. Consequently, the dedicated signal line which sends the malfunction detection signal to the electronic control unit is unnecessary.

However, if the above-mentioned transistor breaks down, any malfunction in both the phase A and the phase B cannot be transmitted, which presents a problem that it is difficult to ensure reliability.

SUMMARY OF THE INVENTION

In view of the above-mentioned problem, the present invention therefore has object to provide an encoder which can transmit an malfunction in both phase A and phase B.

To this end, in accordance with the present invention, an encoder which outputs pulse signals of phase A and phase B displaced with respect to each other according to rotation of a rotary disc and also outputs a pulse signal of phase Z at a predetermined rotational position comprises comparators which are provided in such a manner as to correspond to phase A and phase B respectively and detect a state where voltages of output lines of the phase A and the phase B deviate from their corresponding normal ranges, and switching elements connected to an output line of phase Z to be turned on or off according to outputs of comparators, wherein information on malfunction in the phase A and the phase B is outputted to the output line of the phase Z.

According to the encoder of the present invention, each of phase A and phase B is provided with a comparator and a switching element, and the switching elements of the phase A and phase B are connected to the output line of phase Z independently of each other, and therefore, even if the switching element in one phase breaks down, a malfunction in the other phase is reliably outputted to the output line of the phase Z so as to be detected, thus providing an effect of improving the reliability.

These and other object, features, aspects and advantages of the present invention will be become apparent to those skilled in the art from the following detailed description, which, taken in conjunction with the annexed drawings, discloses a preferred embodiments of the present invention.

DETAILED DESCRIPTION OF THE PREFERRED EMBODIMENTS

Selected embodiments of the present invention will now be explained with reference to the drawings. It will be apparent to those skilled in the art from this disclosure that the following description of the embodiments of the present invention is provided for illustration only, and not for the purpose of limiting the invention as defined by the appended claims and their equivalents Hereinafter, embodiments of the present invention will be described in detail.

Figure 1:
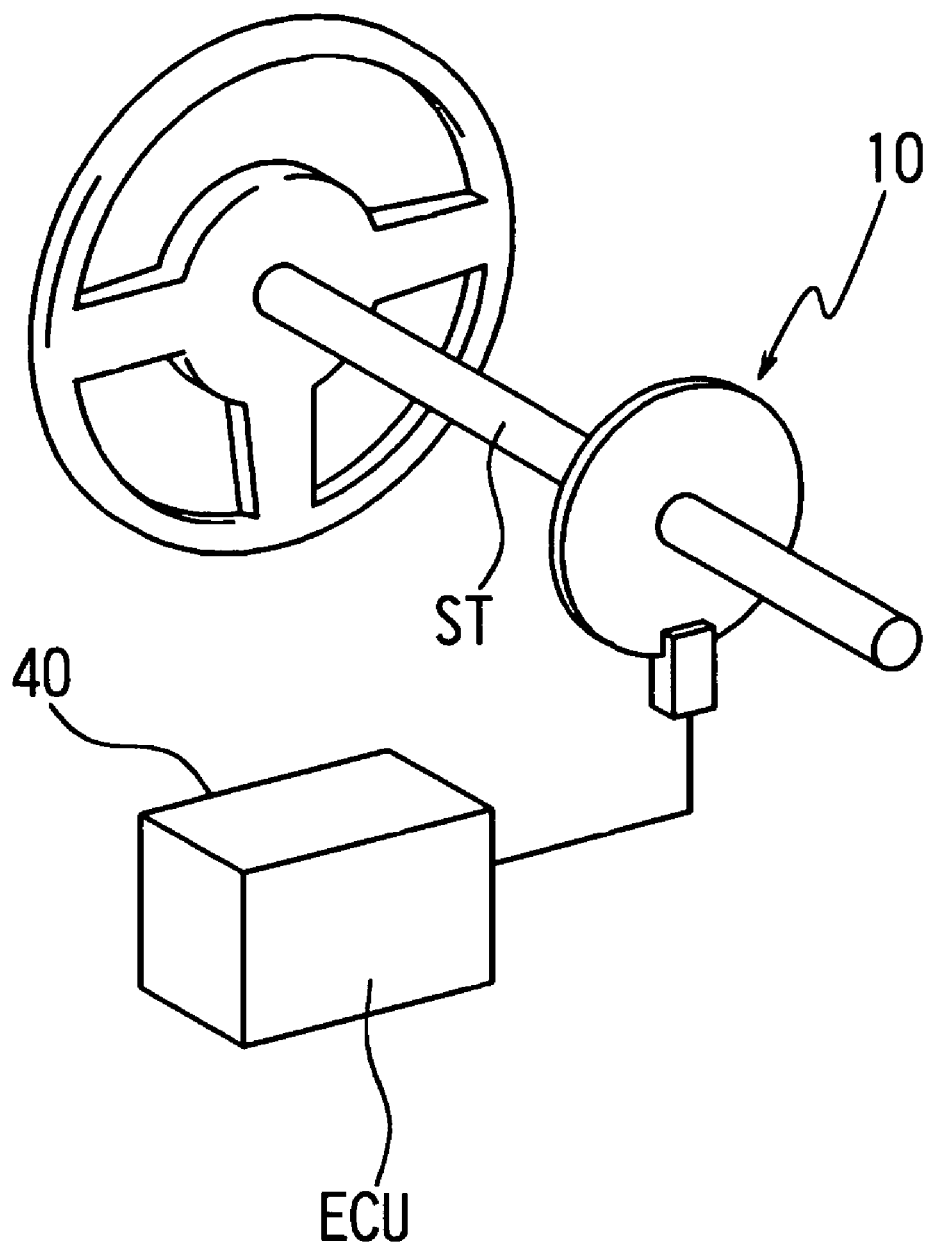
FIG. 1 is a view showing a example of mounting of an embodiment.
Figure 2:
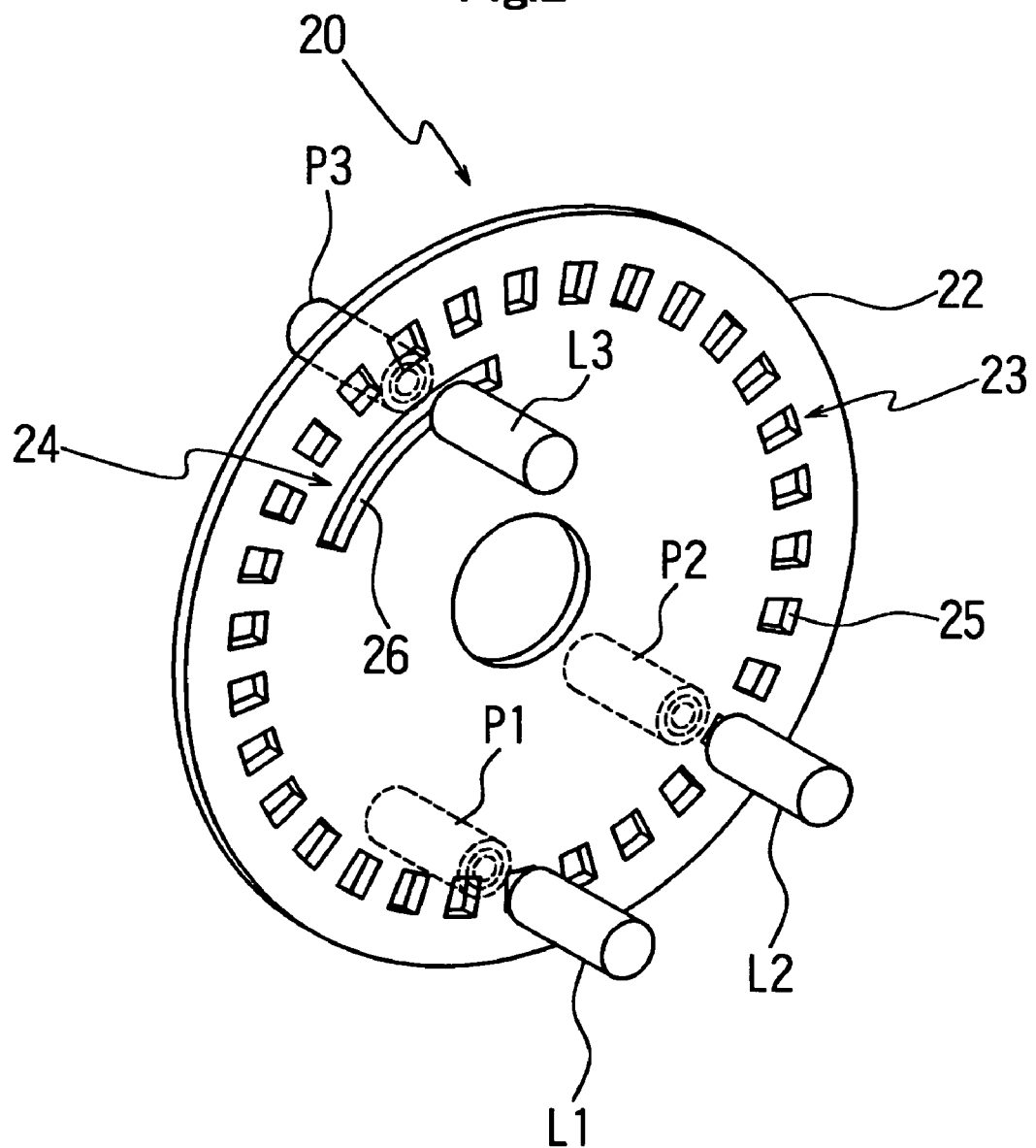
FIG. 2 is an explanatory view showing a layout of a rotation detecting selection.

FIG. 1 shows an example of the mounting of an embodiment and FIG. 2 is an explanatory view showing a layout of a rotation detecting section.

An encoder 10 is mounted on a steering shaft ST of a vehicle and is used for detection of a steering angle or the like of a steering wheel.

The encoder 10 comprises a rotation detecting section 20 and a sensor circuit 30 to be later described.

As shown in FIG. 2, the rotation detecting section 20 of the encoder 10 comprises a slit plate 22 which is a disc provided with a track consisting of slits, light emitting diodes L1, L2, and L3 as light emitting devices, and phototransistors P1, P2 and P3 as light receiving devices. The track on the slit plate 22 comprises a first track 23, on which slits 25 of a predetermined length are circumferentially placed at even intervals, and a second track 24, on which one slit 26 longer than one of the slits 25 of the first track is disposed at a predetermined circumferential position.

The light emitting diode L1 and the phototransistor P1 are arranged opposing each other with the slit plate 22 placed therebetween on the first track 23, and output a pulse signal of phase A with the rotation of the slit plate 22.

The light emitting diode L2 and the phototransistor P2 are also arranged opposing each other with the slit plate 22 placed therebetween on the first track 23, and output a pulse signal of phase B with the rotation of the slit plate 22.

The light emitting diode L3 and the phototransistor P3 are arranged opposing each other with the slit plate 22 placed therebetween on the second track 24, and output a pulse signal of phase Z.

Figure 3:
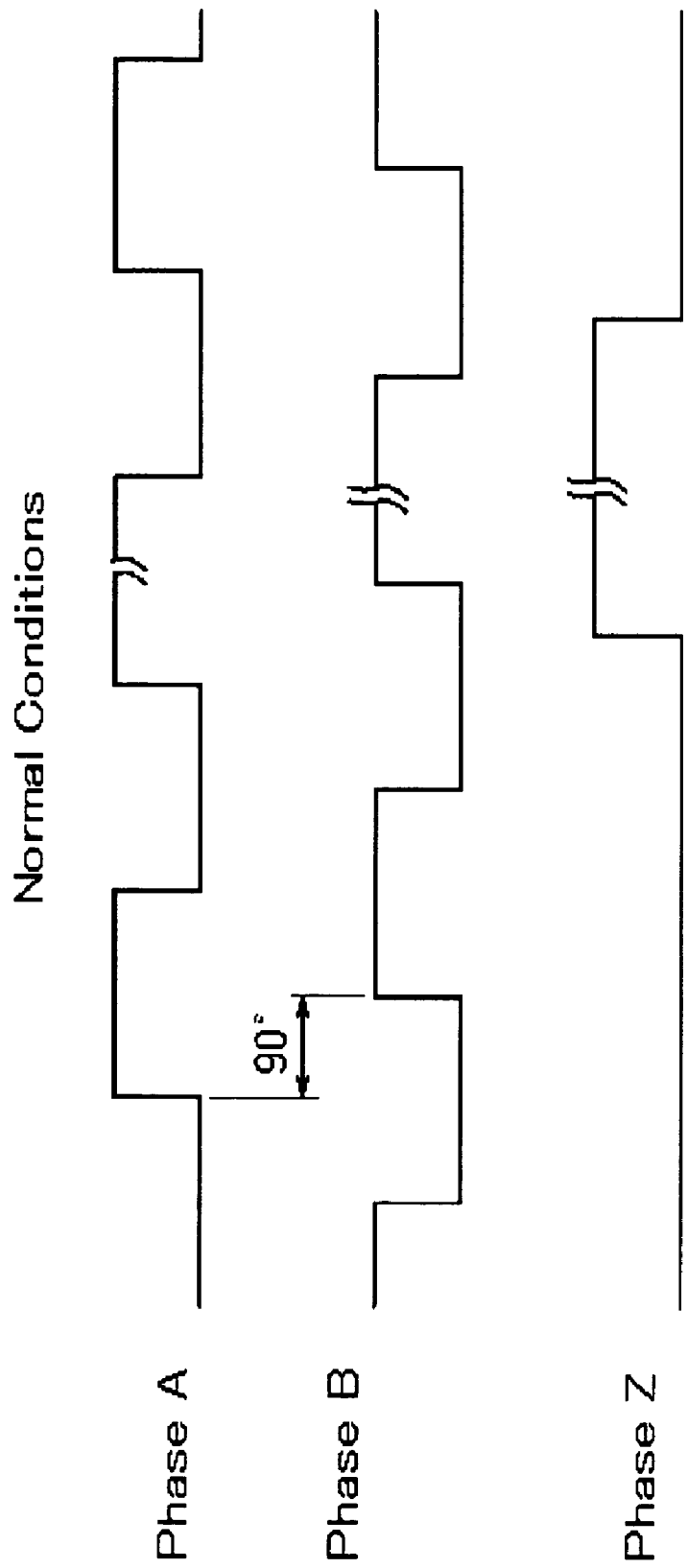
FIG. 3 is a diagram showing a pulse signal sequence of each phase by the rotation detecting section.

The slits 25 on the first track 23, and the light emitting diodes L1 and L2 and the phototransistors P1 and P2 are set so that pulse signal of phase A and the pulse signal of phase B are out of phase with each other by 90 degrees as shown in FIG. 3.

The pulse signal of phase Z is outputted once for every one rotation of the slit plate 22.

The encoder 10 outputs each pulse signal of phase A, phase B, and phase Z detected by the rotation detecting section 20 to an electronic control unit (ECU) 40 through a sensor circuit 30 to be later described, as shown in FIG. 1.

In the electronic control unit 40, the speed and direction of the rotation of the slit plate 22, i.e. the steering wheel can be obtained by comparison between the pulse signals of phase A and phase B. Further, the origin of rotation can be recognized from the pulse signal of phase Z.

Figure 4:
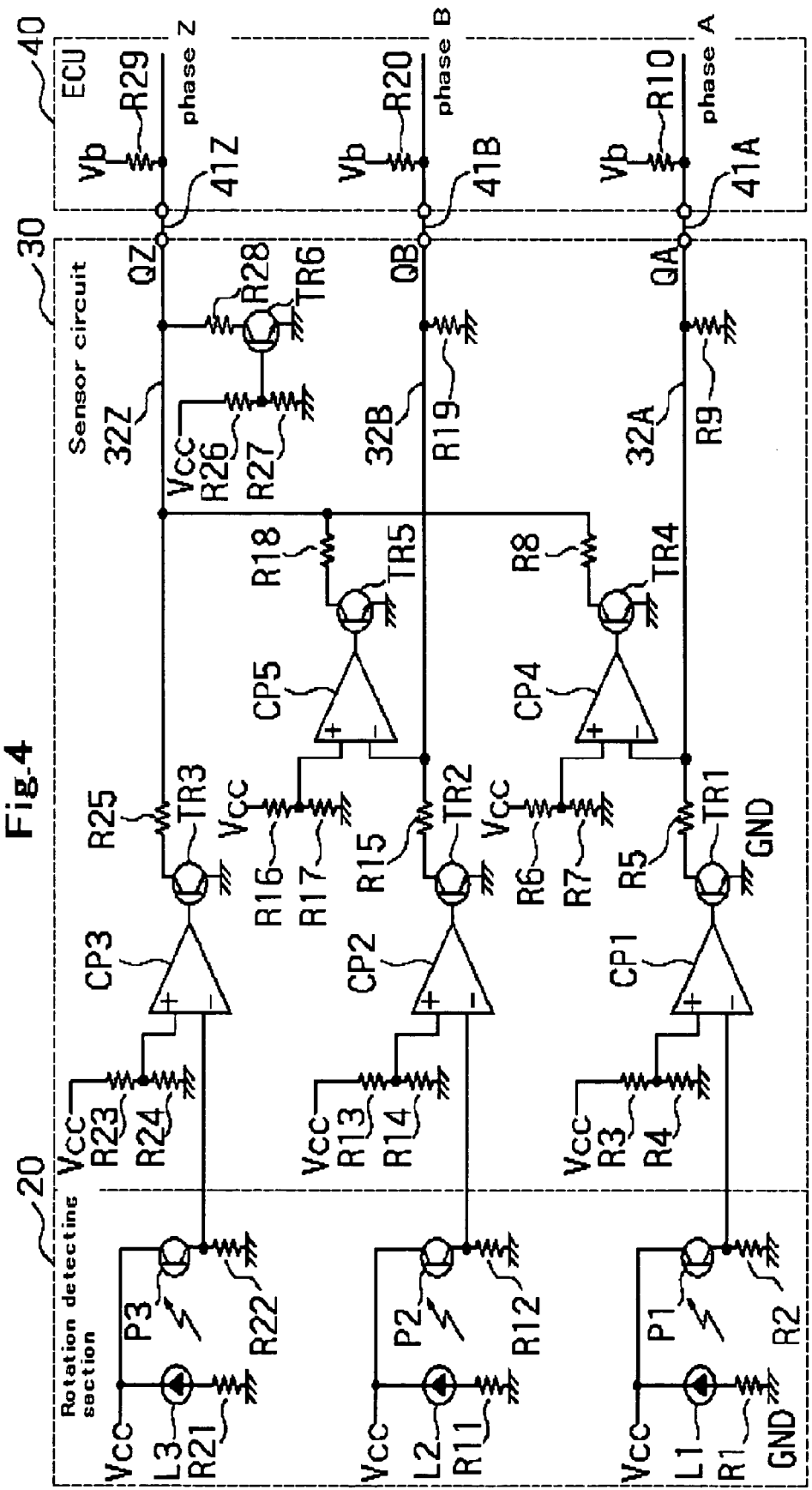
FIG. 4 is a diagram showing a circuit configuration of a encoder.

FIG. 4 shows a circuit configuration of the encoder.

In the rotation detecting section 20, the light emitting diodes L1, L2, and L3 are connected to a power source Vcc in series with resistors R1, R11, and R21, respectively. The phototransistors P1, P2, and P3, which receive light from the respective corresponding light emitting diodes, are connected in series with resistors R2, R12, and R22, respectively, and each phototransistor is grounded to the power source Vcc and each resistor to a ground (GND).

A junction between the phase-A phototransistor P1 and the resistor R2 is inputted to an inverting input (−) of a comparator CP1 in the sensor circuit 30 as an output of the rotation detecting section 20. A divided voltage produced by voltage dividing resistors R3 and R4 disposed in series between the power source Vcc and the ground is inputted to a non-inverting input (+) of the comparator CP1 as a reference voltage.

An output of the comparator CP1 is connected to a base of an NPN-type transistor TR1.

An emitter of the transistor TR1 is grounded, and a collector of the same is connected through a resistor R5 and an output line 32A to an output terminal QA connecting to the electronic control unit 40. A resistor R9 is provided between the output terminal QA and the ground.

Within the electronic control unit 40, a signal line 41A (phase-A input line) connected to the output terminal QA is connected through a pull-up resistor R10 to a power source Vb.

A junction between the resistor R5 and the output terminal QA is inputted to an inverting input of a comparator CP4 for malfunction detection. A divided voltage produced by voltage dividing resistors R6 and R7 disposed in series between the power source Vcc and the ground is inputted to a non-inverting input of the comparator CP4 as a malfunction determination voltage.

An output of the comparator CP4 is connected to a base of an NPN transistor TR4.

Similarly, a junction between the phase-B phototransistor P2 and the resistor R12 is inputted to an inverting input of a comparator CP2, and a divided voltage produced by voltage dividing resistors R13 and R14 disposed in series between the power source Vcc and the ground is inputted to a non-inverting input of the comparator CP2 as a reference voltage.

An output of the comparator CP2 is connected to a base of an NPN transistor TR2.

An emitter of the transistor TR2 is grounded, and a collector of the same is connected through a resistor R15 and an output line 32B to an output terminal QB connecting to the electronic control unit 40. Within the electronic control unit 40, a signal line 41B (phase-B input line) connected to the output terminal QB is connected through a pull-pull resistor R20 to the power source Vb.

A resistor R19 is provided between the output terminal QB and the ground.

A junction between the resistor 15 and the output terminal QB is inputted to an inverting input of a comparator CP5 for malfunction detection, and a divided voltage produced by voltage dividing resistors R16 and R17 disposed in series between the power source Vcc and the ground is inputted to a non-inverting input of the comparator CP5 as a malfunction determination voltage.

An output of the comparator CP5 is connected to a base of an NPN transistor TR5.

A junction between the phase-Z phototransistor P3 and the resistor R22 is inputted to an inverting input of a comparator CP3, and a divided voltage produced by voltage dividing resistors R23 and R24 disposed in series between the power source Vcc and the ground is inputted to a non-inverting input of the comparator CP3 as a reference voltage.

An output of the comparator CP3 is connected to a base of an NPN transistor TR3.

An emitter of the transistor TR3 is grounded, and a collector of the same is connected through a resistor R25 and an output line 32Z to an output terminal QZ connecting to the electronic control unit 40. Within the electronic control unit 40, a signal line 41Z (phase-Z input line) connected to the output terminal QZ is connected through a pull-up resistor R29 to the power source Vb.

The phase-Z output terminal QZ is grounded through a resistor 28 connected in series therewith and an NPN transistor TR6 to the ground. A divided voltage produced by voltage dividing resistors R26 and R27 disposed in series between the power source Vcc and the ground is inputted to a base of the transistor TR6.

An emitter of the transistor TR4 connected to the phase-A comparator CP4 is grounded, and a collector of the same is connected through a resistor R8 and the output line 32Z to the phase-Z output terminal QZ.

Likewise, an emitter of the transistor TR5 connected to the phase-B comparator CP5 is grounded, and a collector of the same is connected through a resistor R18 and the output line 32Z to the phase-Z output terminal QZ.

The resistors R8 and R18 have a lower resistance setting, compared to the resistor R25 and R28 provided in phase Z.

In phase A, when the light emitting diode L1 and the phototransistor P1 are located at the position of one of the slits 25 in the slit plate 22 and the phototransistor P1 receives light (ON) from the light emitting diode L1, an electric current flows through the resistor R2 and an electric potential at the junction between the phototransistor P1 and the resistor R2 increases. The resistor R2 and the voltage dividing resistors R3 and R4 are set so that this increased voltage at the junction will be higher than the divided voltage produced by the voltage dividing resistors R3 and R4.

Therefore, when the phototransistor P1 receives light (ON), the output of the comparator CP1 becomes L and the transistor TR1 is turned off. As a result, the potential of the output terminal QZ corresponds to a divided voltage produced by the pull-up resistor R10 of the power source Vb and the resistor R9.

When the phototransistor P1 does not receives light (OFF), the transistor TR1 is contrarily turned on and the potential of the output terminal QA corresponds to a divided voltage produced by the pull-up resistor R10 of the power source Vb and the resistors R5 and R9.

For example, if resistance values are set as R5=200 Ù, R9=4 KÙ, and R10=1 KÙ with the supply voltage Vb=5 V, the output terminal QA shows 4 V when the phototransistor P1 is ON, and it shows 0.8 V when the phototransistor is OFF.

The same applies to the relationship between the resistor R12 and the voltage dividing resistors R13 and R14 as well as the relationship between the pull-up resistor R20 and the resistors R15 and R19 in phase B.

The relationship between the resistor R22 and the voltage dividing resistor R23 and R24 in phase Z is also provided in the same manner.

Further, the voltage dividing resistors R16 and R17 in phase B are set as is the case with the voltage dividing resistors R6 and R7.

The voltage dividing resistors R26 and R27 and the transistor TR6 in phase Z are intended for detection of a break in the power source Vcc or the ground in the sensor circuit 30, and the transistor TR6 is ON when there is no break. Namely, the voltage dividing resistors R26 and R27 are set so that their divided voltages bring the transistor TR6 ON.

In this state, the relationship between the pull-up resistor R29 and the resistors R25 and R28 is also the same as the relationship between the pull-up resistor 10 and the resistors R5 and R9 in phase A.

Therefore, when there is no break in the power source Vcc or the ground, the phase-B output terminal QB and phase-Z output terminal QZ each show 4 V when the phototransistors P2 and P3 are ON, and they each show 0.8 V when the phototransistors P2 and P3 are OFF.

Figure 5:
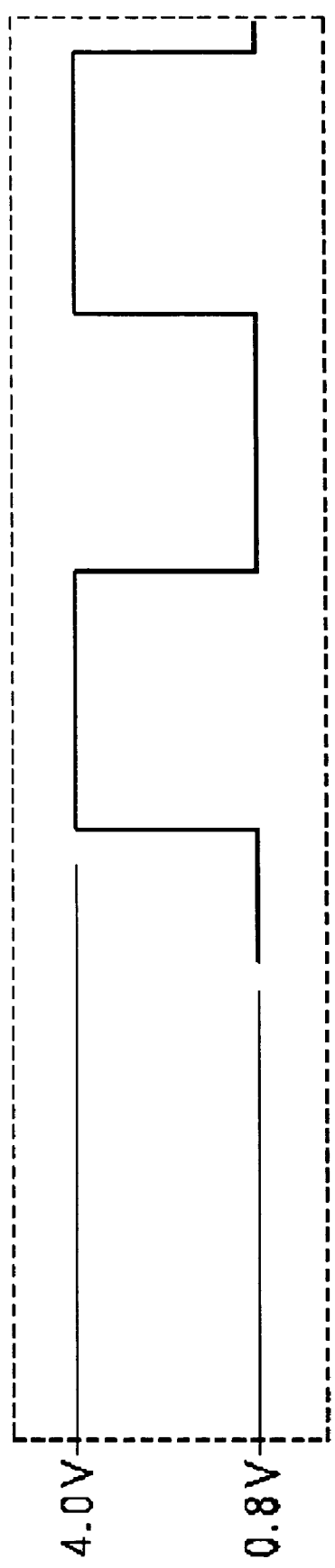
FIG. 5 is a diagram showing a voltage change which takes place at an output terminal of each phase under normal conditions.

FIG. 5 shows a voltage change which takes place at the output terminal of each phase under normal conditions.

When, in phase A or phase B, the signal line 41A or 41B between each output terminal QZ or QB and the electronic control unit 40 is broken, a pull-up voltage produced through the pull-up resistor R10 or R20 disappears within the sensor circuit 30, and consequently the voltage of the output line 32A or 32 B connecting to the relevant phase output terminal QA or QB becomes 0 V. Also, when the above-mentioned output line connecting to the output terminal QA or QB is short-circuited to the ground, the voltage of the output line similarly becomes 0 V.

Additionally, when the output line 32Z connecting to the phase-Z output terminal QZ is short-circuited to the ground, the voltage of the output line also becomes 0 V.

The voltage dividing resistors R6 and R7 connected to the non-inverting input of the phase-A comparator CP4 are set so as to produce a divided voltage of less than 0.8 V as a malfunction determination voltage in order that the output of the comparator CP4 should not bring the transistor TR4 ON in the voltage range of the output terminal QA under normal conditions.

The voltage dividing resistors R6 and R7 connected to the phase-B comparator CP5 are also set so as to produce the malfunction determination voltage.

Figure 6:
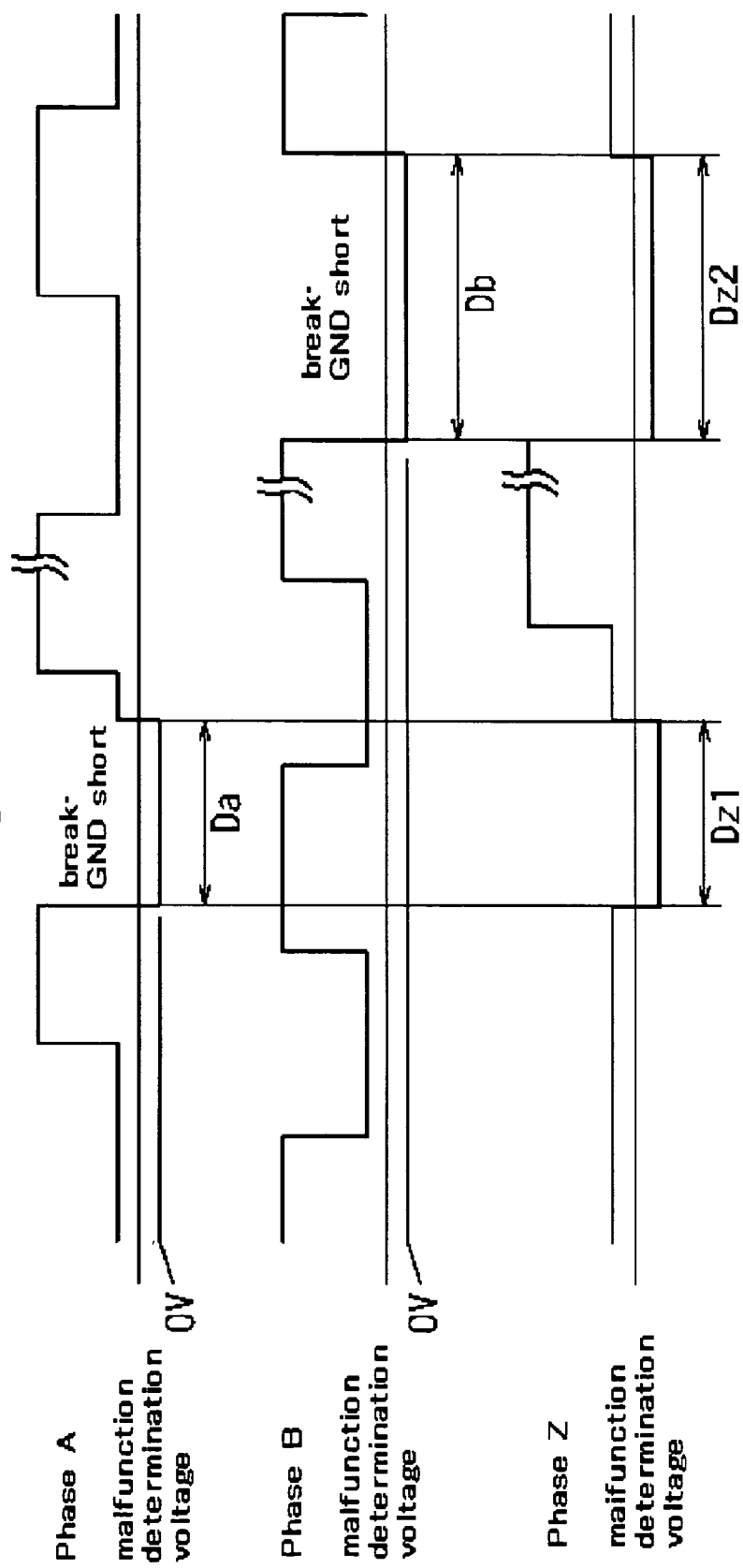
FIG. 6 is a diagram showing a voltage change which takes place in each phase in a sensor circuit when a malfunction occurs.

When the voltage of the phase-A output line 32A becomes 0 V, as indicated by Da in FIG. 6, due to a break in the signal line 41A or a short circuit to ground of the output line 32A connecting to the output terminal QA within the sensor circuit 30, the output of the comparator CP4 brings the transistor TR4 ON and the phase-Z output terminal QZ is grounded through the resistor R8 to the ground.

Since the resistor R8 has a lower resistance setting, compared to the resistors R25 and R28, the voltage of the phase-Z output terminal QZ significantly decreases to a value lower than 0.8 V which is observed when the phototransistor P3 is OFF under normal conditions, as indicated Dz1 in FIG. 6.

Similarly, when the voltage of the phase-B output line 32B becomes 0 V, as indicated by Db in FIG. 6, due to a break in the signal ling 41B or a short circuit to ground of the output line 32B connecting to the output terminal QB, the output of the comparator CP5 brings the transistor TR5 ON and the output line 32Z connecting to the phase-Z output terminal QZ is grounded through the resistor R18 to the ground. As a result, the voltage of the phase-Z output terminal QZ similarly decreases significantly as indicated by Dz2 in FIG. 6.

Thus, when, within the sensor circuit 30, the signal line 41A or 41B is broken, or the output line 32A or 32B connecting to the output terminal QA or QB is short-circuited to ground in phase A or B, the relevant malfunction is outputted to the phase-Z output line 32Z.

Here, if Vb=5.00±0.25 V, allowing for fluctuations in the supply voltage, pulse signals which the electronic control unit 40 receives from the output terminals QA, QB, and QZ of each of the A, B, and Z under normal conditions fall within a range of 0.6 to 4.4 V.

Figure 7:
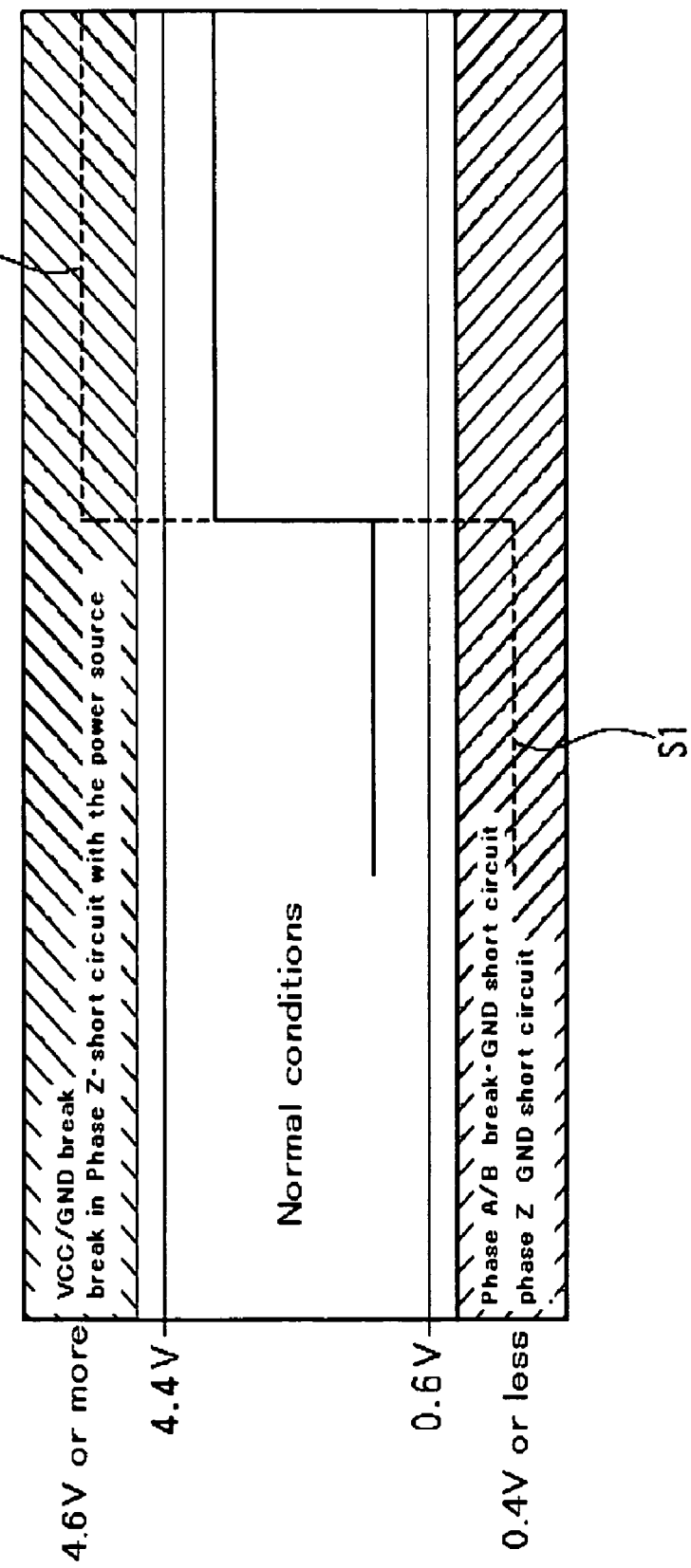
FIG. 7 is an explanatory diagram showing procedure for determining a malfunction according to the voltage level of each phase.

Then, considering the above-mentioned signal range under normal conditions, the electronic control unit 40 judges that there is malfunction due to a break in the phase-A or phase-B signal line 41A or 42B or a short circuit to ground of the output line 32A or 32B connecting to the output terminal QA or QB, or a malfunction due to a short circuit to ground of the output line 32Z connecting to the phase-Z output terminal QZ when the voltage of the input line connecting to the phase-Z output terminal QZ becomes 0.4 V or less, as indicated by a broken line S1 in FIG. 7.

Next, when, in phase Z, the source Vcc or the ground is broken within the sensor circuit 30, turning-off of the transistor TR6 makes the voltage of the output terminal QZ equal to that of the power source Vb.

Then, considering the above-mentioned range of signals under normal conditions, the electronic control unit 40 detects an input voltage of 4.6 V or more from phase Z as a malfunction due to a break in the power source Vcc or the ground, as indicated by a broken line S2 in FIG. 7.

Also, when the signal line 41C between the phase-Z output terminal QZ and the electronic control unit 40 is broken, the voltage of the phase-Z input line seen from the electronic control unit 40 becomes equal to that of the power source Vb.

Likewise, when the output line 32Z connecting to the phase-Z output terminal QZ is short-circuited with the power source Vcc within the sensor circuit 30, the voltage of the phase-Z input line seen from the electronic control unit 40 becomes equal to that of the power source Vb.

Therefore, the electronic control unit 40 can detect the occurrence of a malfunction due to a break in the power source Vcc or the ground, a break in phase Z, or a short circuit with the power source Vcc in phase Z when the voltage of the input line from phase Z is 4.6 V or more.

The present embodiment is configured as described above, and it includes the comparators CP4 and CP5 that are provided in such a manner as to correspond to phase A and phase B respectively and detect a state where the voltages of the output lines 32A and 32B deviate from their respective normal ranges, and the transistors TR4 and TR5 that are turned on or off according to the outputs of the respective corresponding comparators and are connected respectively to the phase-Z output line 32Z, wherein information on a malfunction in phase A and phase B is outputted to the phase-Z output line 32Z. Accordingly, even if the transistor of one phase breaks down, a malfunction in the other phase is reliably reflected in the output of phase Z. Therefore, there is no more possibility that a breakdown in just one transistor completely hinders a malfunction in both phases from being detected, thus leading to an improved reliability.

The transistors TR4 and TR5 are connected in series with the resistor R8 and R18, respectively, and thus the output voltage of phase Z fluctuates in accordance with a voltage drop in the relevant resistor when the corresponding transistor is turned on, whereby the occurrence of a malfunction is easily detected.

Further, in the above-mentioned embodiment, assuming that the resistors 8 and R18, which connect the transistors TR4 and TR5 respectively to the output line 32Z connecting to the phase-Z output terminal QZ, have the same resistance value, the electronic control unit 40 detects the occurrence of malfunction due to a break in the phase-A or phase-B signal line 41A or 41B or a short circuit to ground of the output line 32A or 32B connecting to the output terminal QA or QB, or a malfunction due to a short circuit to ground of the output line 32Z connecting to the phase-Z output terminal QZ by the voltage of the phase-Z input line becoming a predetermined value (0.4 V) or less, but, as an example of variation, making the resistors R8 and R18 have different resistance value further renders it possible to determine which of the phase A, B, and Z has the malfunction.

When the resistors R8 and R18 are made to have different resistance value, the degree of voltage drop of the phase-Z output terminal QZ when the transistor TR4 is turned on due to a malfunction in phase A differs from that of phase-Z output terminal QZ when the transistor TR5 is turned on due to a malfunction 5 in phase B.

Figure 8:
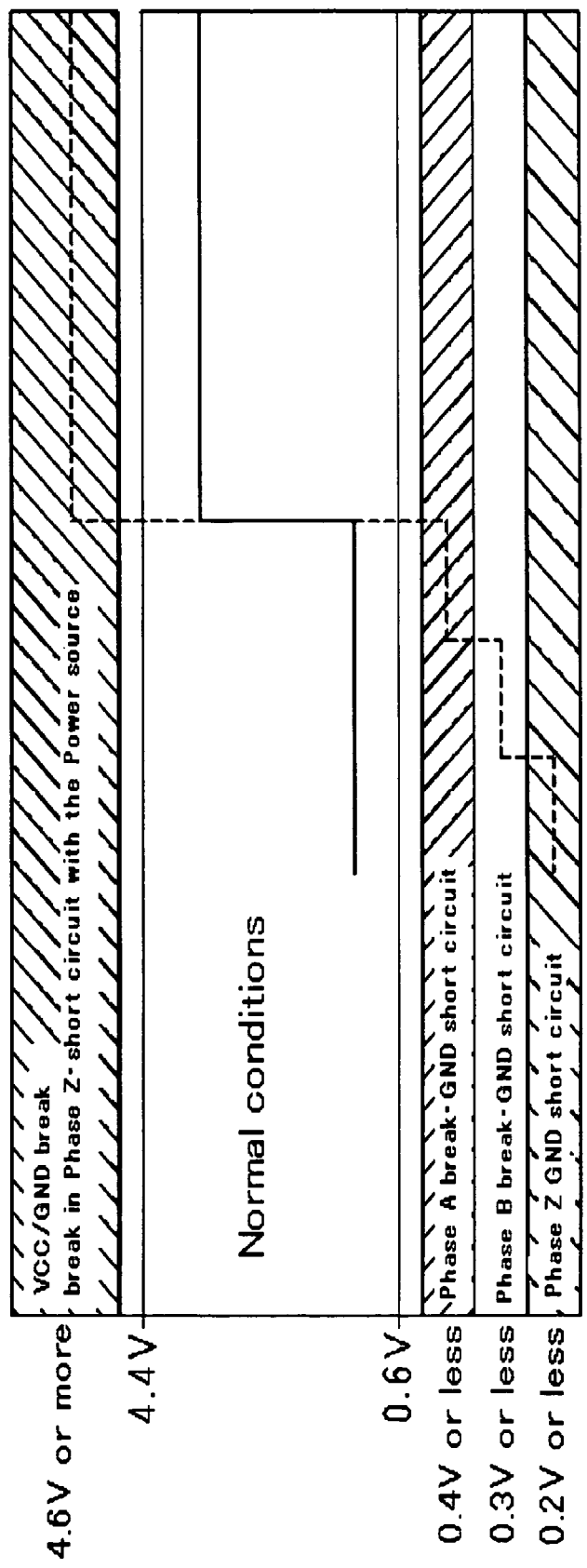
FIG. 8 is an explanatory view showing a procedure for determining a malfunction by an example of variation of the embodiment.

This enables the following voltage ranges as indicated by a broken line in FIG. 8. For example, when the phase-A signal line 41A is broken or the output line 32A connecting to the output terminal QA is short-circuited to ground, the voltage of the phase-Z input line of the electronic control unit 40 is higher than 0.3 V and not over 0.4 V. When the phase-B signal line 41B is broken or the output line 32B connecting to the output terminal QB is short-circuited to ground, the voltage of the phase-Z input line is higher than 0.2 V and not over 0.3 V. When the output line 32Z connecting to the phase-Z output terminal QZ is short-circuited to ground, the voltage of the phase-Z input line is 0.2 V or less.

Therefore, it is possible to determine which of the phases A, B, and Z has a malfunction according to the voltage level of the phase-Z input line.

In addition, description has been made of an example of an encoder used for detection of a steering angle of a steering wheel of a vehicle in the embodiment, but the present invention is not limited thereto and is applicable to encoders for detecting various rotation angles.

Further, using the transistors TR4 and TR5 as switching elements particularly offers the advantage of being able to reduce the cost, but other switching elements can be used a required.

Furthermore, the phototransistors P1, P2, and P3 are used as light receiving devices of the rotation detecting section 20 in the embodiment, but in addition to these, photodiodes can be used as light receiving devices.

This application claims priority to Japanese Patent Application No. 2003-387505. The entire disclosure of Japanese Patent Application No. 2003-387505 is hereby incorporated herein by reference.

While only selected embodiments have been chosen to illustrate the present invention, it will be apparent to those skilled in the art from the disclosure that various changes and modifications can be made herein without departing from the scope of the invention as defined in the appended claims. Furthermore, the foregoing description of the embodiments according to the present invention is provided for illustration only, and not for the purpose of limiting the invention as defined by the appended claims and their equivalents.

10: ENCODER
20: ROTATION DETECTING SECTION
22: SLIT PLATE (ROTARY DISC)
23: FIRST TRACK
24: SECOND TRACK
25, 26: SLIT
30: SENSOR CIRCUIT
32a, 32b, 32Z: OUTPUT LINE
40: ELECTRONIC CONTROL UNIT
41A, 41B, 41Z: SIGNAL LINE
CP1, CP2, CP3: COMPARATOR
CP4, CP5: COMPARATOR (COMPARATOR)
L1, L2, L3: LIGHT EMITTING DIODE
P1, P2, P3: PHOTOTRANSISTOR
QA, QB, QZ: OUTPUT TERMINAL
R1, R2, R5, R9, R11, R15, R12: RESISTOR
R3, R4, R6, R7, R13, R14, R16: VOLTAGE DIVIDING RESISTOR
R8, R18: RESISTOR (RESISTOR)
R10, R20, R29: PULL-UP RESISTOR
R17, R23, R24, R26, R27: VOLTAGE DIVIDING RESISTOR
R19, R21, R22, R25, R28: RESISTOR
ST: STEERING SHAFT
TR1, TR2, TR3, TR6: TRANSISTOR
TR4, TR5: TRANSISTOR (SWITCHING ELEMENT)
Vb, Vcc: POWER SOURCE

What is claimed is:

1. An encoder which outputs pulse signals of phase A and phase B displaced with respect to each other according to rotation of a rotary disc and outputs a pulse signal of phase Z at a predetermined rotational position, comprising:
   comparators which are provided in such a manner as to correspond to phase A and B respectively to detect a state where voltages of output lines of phase A and phase B deviate from their corresponding normal ranges; and
   switching elements connected to an output line of phase Z to be turned on or off according to outputs of the comparators,
   wherein information on a malfunction in the phase A and the phase B is outputted to the output line of phase Z.

2. The encoder as set forth in claim 1, wherein the switching elements include transistors.

3. The encoder as set forth in claim 2, wherein the transistors are disposed in series with resistors which are connected in parallel between the output line of the phase Z and the ground.

4. The encoder as set forth in claim 3, wherein the resistors have different resistance values, which allows identifying the malfunction in the phase A and the phase B.

* * * * *

UNITED STATES PATENT AND TRADEMARK OFFICE
CERTIFICATE OF CORRECTION

PATENT NO. : 6,989,771 B2  
DATED : January 24, 2006  
INVENTOR(S) : Masahiro Tokue It is certified that error appears in the above-identified patent and that said Letters Patent is hereby corrected as shown below:

<u>Title page,</u>  
Item [57], ABSTRACT,  
Line 11, "a electronic" should read -- an electronic --.

Signed and Sealed this

Eleventh Day of April, 2006

JON W. DUDAS  
*Director of the United States Patent and Trademark Office*